US009723744B1

(12) United States Patent
Fricker

(10) Patent No.: US 9,723,744 B1
(45) Date of Patent: Aug. 1, 2017

(54) INFORMATION TECHNOLOGY RACKS WITH INTEGRATED DATA SIGNAL AND POWER DISTRIBUTION

(71) Applicant: EMC Corporation, Hopkinton, MA (US)

(72) Inventor: Jean-Philippe Fricker, Mountain View, CA (US)

(73) Assignee: EMC IP Holding Company LLC, Hopkinton, MA (US)

( * ) Notice: Subject to any disclaimer, the term of this patent is extended or adjusted under 35 U.S.C. 154(b) by 56 days.

(21) Appl. No.: 14/981,698

(22) Filed: Dec. 28, 2015

(51) Int. Cl.
*H05K 5/00* (2006.01)
*H05K 7/14* (2006.01)

(52) U.S. Cl.
CPC ......... *H05K 7/1439* (2013.01); *H05K 7/1447* (2013.01); *H05K 7/1457* (2013.01)

(58) Field of Classification Search
CPC .... H05K 7/20709; H05K 7/10; H05K 7/1439; H05K 7/1447; H05K 7/1457
USPC ..................... 361/724–727; 211/26
See application file for complete search history.

(56) References Cited

U.S. PATENT DOCUMENTS

| | | | | |
|---|---|---|---|---|
| 7,791,890 B2* | 9/2010 | Ishida | ................. | H05K 7/1492 211/26 |
| 2004/0212973 A1* | 10/2004 | Ice | ................. | H05K 7/1418 361/796 |
| 2004/0264133 A1* | 12/2004 | Fukuda | ................. | G11B 33/142 361/695 |
| 2006/0012950 A1* | 1/2006 | Shih | ................. | G06F 1/184 361/679.33 |
| 2010/0177465 A1* | 7/2010 | Lu | ................. | G06F 1/182 361/679.01 |

\* cited by examiner

*Primary Examiner* — Nidhi Thaker
(74) *Attorney, Agent, or Firm* — Chamberlain Hrdlicka

(57) ABSTRACT

An information technology (IT) rack that includes IT appliances, housed by the IT rack, and a set of backplanes. Each backplane includes appliance-interfacing connectors. Insertion of the IT appliances into the IT rack causes mating of backplane-interfacing connectors of the IT appliances with the appliance-interfacing connectors. The IT rack further includes a centrally located interface to which the appliance-interfacing connectors are wired. The centrally located interface determines a connectivity of the IT appliances.

21 Claims, 6 Drawing Sheets

INFORMATION TECHNOLOGY RACKS WITH INTEGRATED DATA SIGNAL AND POWER DISTRIBUTION

BACKGROUND

Information technology (IT) racks may be used to house IT appliances, particularly in applications where a high density of IT appliances is desired, e.g., in data centers. IT appliances in an IT rack may require data signal and power connections. In an IT rack populated with IT appliances, many data signal and power connections may be required.

DETAILED DESCRIPTION

Figure 1:
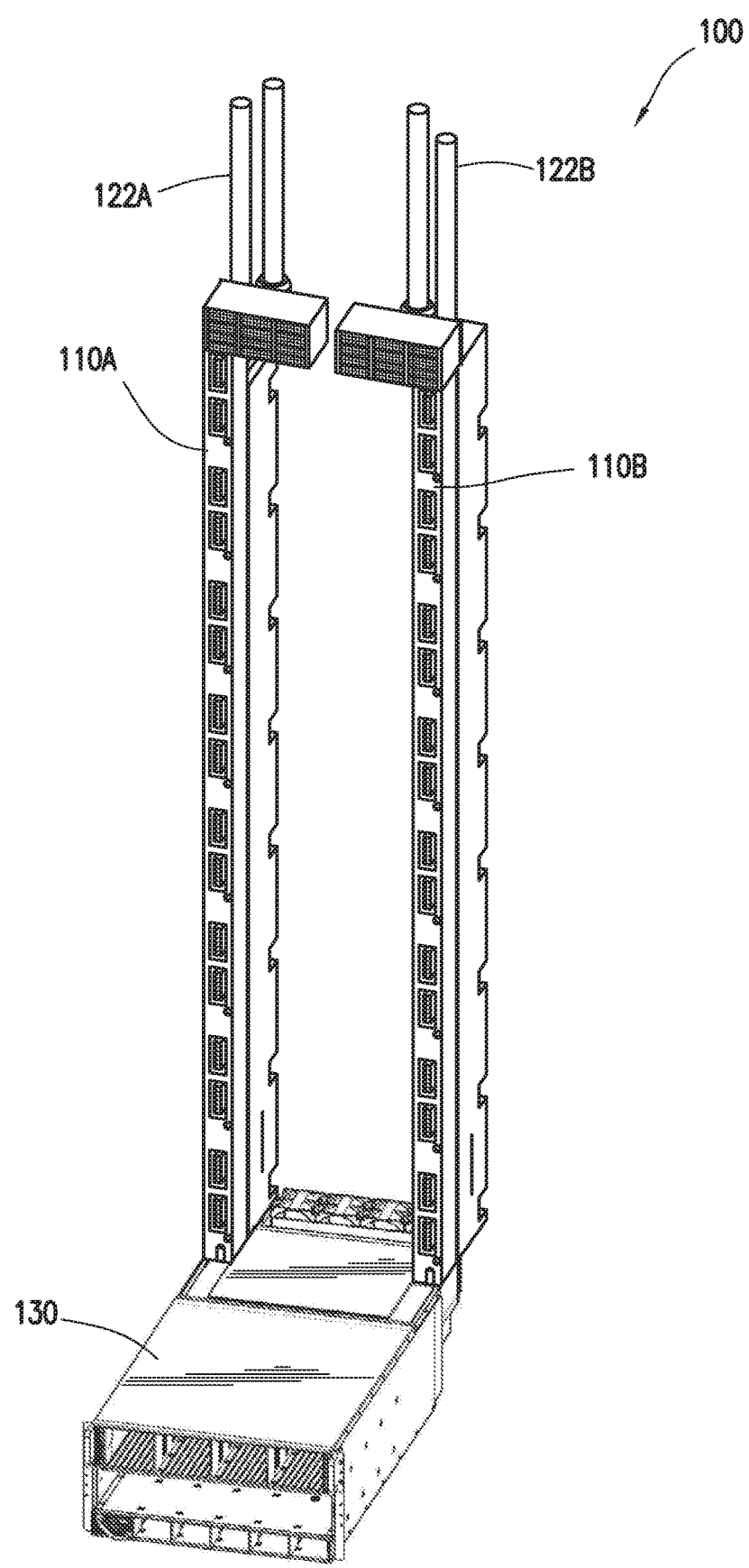
FIG. 1 shows an information technology (IT) rack, in accordance with one or more embodiments of the technology.

Specific embodiments of the technology will now be described in detail with reference to the accompanying figures. Like elements in the various figures are denoted by like reference numerals for consistency.

In the following detailed description of embodiments of the technology, numerous specific details are set forth in order to provide a more thorough understanding of the technology. However, it will be apparent to one of ordinary skill in the art that the technology may be practiced without these specific details. In other instances, well-known features have not been described in detail to avoid unnecessarily complicating the description.

Throughout the application, ordinal numbers (e.g., first, second, third, etc.) may be used as an adjective for an element (i.e., any noun in the application). The use of ordinal numbers is not to imply or create any particular ordering of the elements nor to limit any element to being only a single element unless expressly disclosed, such as by the use of the terms "before", "after", "single", and other such terminology. Rather, the use of ordinal numbers is to distinguish between the elements. By way of an example, a first element is distinct from a second element, and the first element may encompass more than one element and succeed (or precede) the second element in an ordering of elements.

In the following description of FIGS. 1-5, any component described with regard to a figure, in various embodiments of the technology, may be equivalent to one or more like-named components described with regard to any other figure. For brevity, descriptions of these components will not be repeated with regard to each figure. Thus, each and every embodiment of the components of each figure is incorporated by reference and assumed to be optionally present within every other figure having one or more like-named components. Additionally, in accordance with various embodiments of the technology, any description of the components of a figure is to be interpreted as an optional embodiment which may be implemented in addition to, in conjunction with, or in place of the embodiments described with regard to a corresponding like-named component in any other figure.

In general, embodiments of the technology are directed to information technology (IT) racks with integrated data signal and power distribution. More specifically, one or more embodiments disclosed herein may be directed to IT racks that support a broad range of data signal and power distributions schemes that are pre-wired, yet configurable.

An IT rack, in accordance with one or more embodiments of the technology, is pre-wired to provide the connectivity required by the IT equipment housed in the IT rack. IT equipment, in accordance with an embodiment of the technology, includes IT appliances such servers, storage solutions, including solid state storage, network-attached storage, network devices such as routers and switches, etc. The IT rack may include wiring for data signal and power distribution to the IT appliances in the IT rack. However, rather than requiring manual connection of individual connectors when installing an IT appliance in the IT rack, data signal and power connections may be automatically established as the IT appliance is inserted into the IT rack. In one embodiment of the technology, the mechanical insertion of the IT appliance into the IT rack causes data signal and power connectors of the IT appliance to mate with corresponding connectors located, for example, in the back of the IT rack. In one or more embodiments of the technology the IT rack connectors interface with the wiring of the IT rack. The wiring of all IT rack connectors may terminate in a central location of the IT rack, for example on top or at the bottom of the IT rack and may be designed to form a central interface to all connectors of al IT appliances in the IT rack. The connectivity between IT appliances and to other equipment outside the rack may thus be defined by connections made in the central location. The connectivity of IT appliances, housed in an IT rack, in accordance with one or more embodiments of the technology, may thus also be updated without requiring connecting or disconnecting any local IT appliance connectors that may be difficult to access.

FIG. 1 shows a perspective view of the information technology (IT) rack. The IT rack (100) may be any type of enclosure used for housing one or more IT and/or telecommunication appliances (130). The IT rack (100) may be an open frame rack, where the IT appliances (130) are held by a frame, and that may otherwise not enclose the equipment. Alternatively, the IT rack (100) may be a cabinet rack that may partially or fully enclose the one or more IT appliances (130). IT appliances that are inserted into the IT rack may be supported by a tray, may be guided by rails, may be held in place by sets of screws and/or other mounting materials. In the exemplary embodiment shown in FIG. 1, a single IT appliance (130) is inserted into the IT rack (100).

An IT appliance (130) may be any type of rack-mountable IT and/or telecommunication equipment that may include electronic circuits, housed by a rack-mount enclosure. IT appliances may be, for example, servers, storage solutions, including solid state storage, network-attached storage, network devices such as routers and switches, etc. In the exemplary embodiment shown in FIG. 1, the IT appliance (130) is an empty enclosure that may be used as a storage system chassis. Depending on the requirements of the IT appliance and the IT appliance's intended application, different data signal and power interface requirements may arise. An IT rack (100), in accordance with one or more embodiments of the technology, accommodates these requirements, as further described below.

In one or more embodiments of the technology, the IT rack (100) includes backplanes A and B (110A, 110B). A backplane may be designed to interface with the IT appliances' data signal and power connectors and to provide connections from the IT appliances' data signal and power connectors to a central location of the IT rack. Connections interconnecting the IT appliances and/or to connecting the IT appliances to equipment located outside the IT rack may be made in this central location, as further described below. In order to provide such connectivity for all IT appliances in the IT rack, a backplane, in accordance with an embodiment of the technology, may span the entire height of the IT rack, from the bottom-most IT appliance to the top-most appliance. The central location, where all connections from/to the IT appliances terminate may be, for example, at the top, at the bottom, or in the center of the IT rack. Patch panels (118A, 118B) may be installed in the central location to establish an interface for the data signal lines to/from the IT appliances in the IT rack. In addition, power infeeds (122A, 122B) may be installed in the central location to provide power to the IT appliances in the IT rack.

In one or more embodiments of the technology, the backplanes A and B (110A, 110B) are redundant, i.e., they may provide identical connectivity for the same interfaces of an IT appliance. Redundancy may enable the removal of one backplane from the IT rack without affecting the functioning of the IT appliances in the IT rack. A backplane may need to be removed, for example, for maintenance purposes. Alternatively, if both backplanes are simultaneously used to enhance the performance of an IT appliance, e.g., by providing additional communication bandwidth, disconnecting one backplane may enable the IT appliance to continue operating, although with a reduced communication bandwidth. An IT rack in accordance with one embodiment of the technology may include additional backplanes. For example, an IT rack (100) may include a third backplane.

In one embodiment of the technology, a backplane is designed to distribute data signals and power. In alternative embodiments, separate backplanes are used for data signals and power. For example, two redundant backplanes may be used for data signal distribution and two redundant backplanes may be used for power distribution. The backplanes (110A, 110B), in accordance with one or more embodiments of the technology, are designed to provide power and connectivity to and/or from the IT appliances (130) in the IT rack (100) on the back side of the IT appliance, as shown in FIG. 1. The backplanes (110A, 110B) may, on the one hand, be sufficiently wide to accommodate data and power connectors that may interface with the IT appliances, and on the other hand they may be sufficiently narrow to avoid blocking ventilation openings that may be located on the back side of the IT appliances. Backplanes, in accordance with one or more embodiments of the technology, are described in detail below, with reference to FIGS. 2A-2C.

Figure 2A:
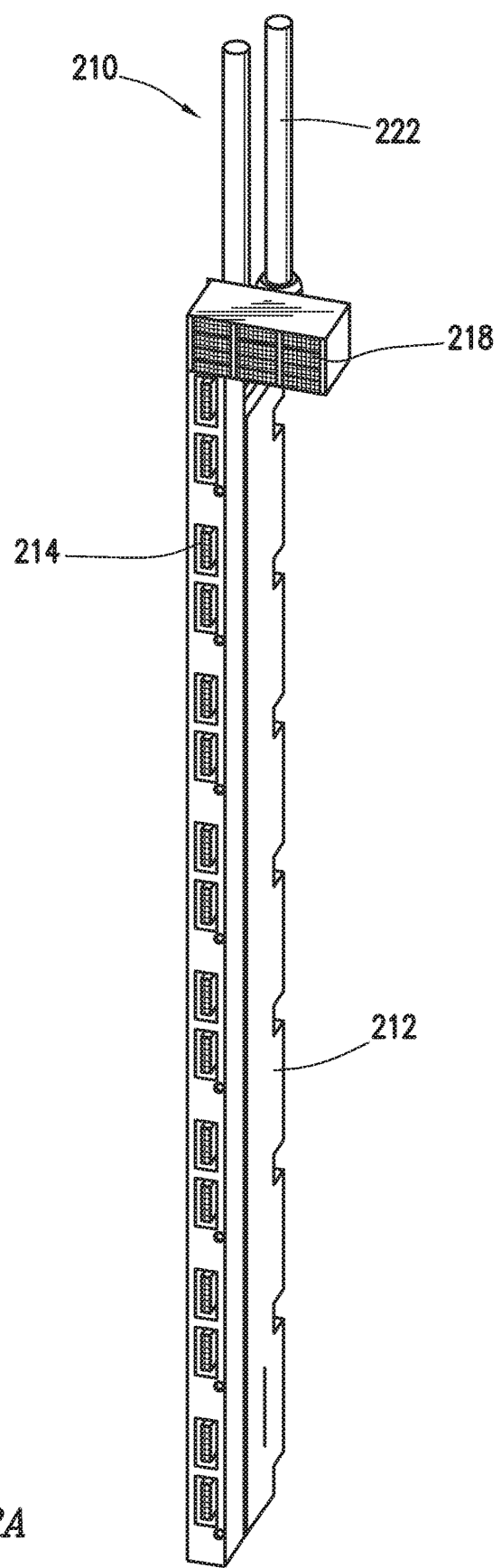
FIGS. 2A-2C show a backplane of an IT rack in accordance with one or more embodiments of the technology.
Figure 2B:
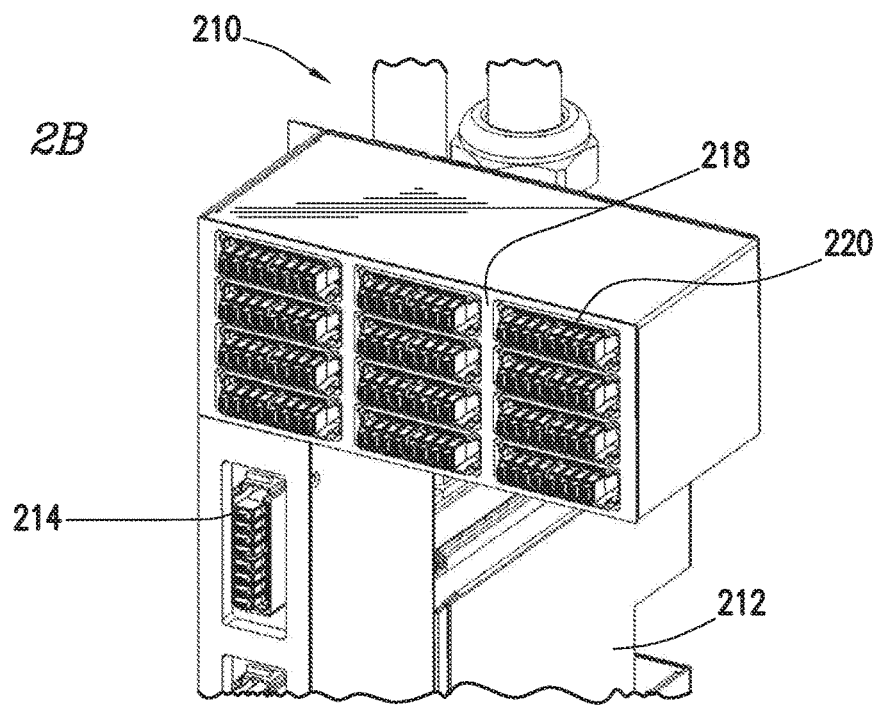
Figure 2C:
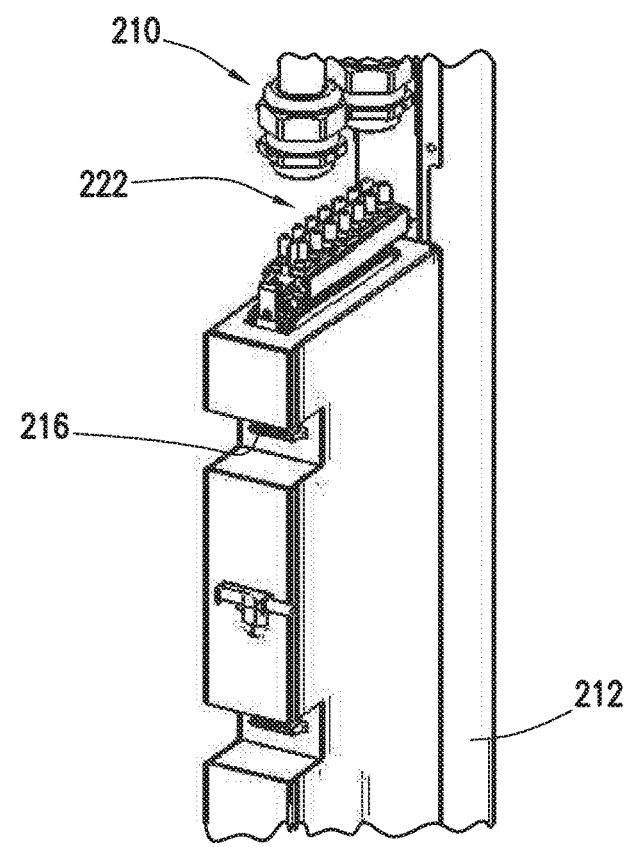

FIGS. 2A-2C show perspective views of a backplane in accordance with one or more embodiments of the technology. FIG. 2A shows the entire backplane (210), including the front of the backplane that may face the IT appliances inserted into an IT rack, equipped with the backplane (210). FIG. 2B shows a detail view of the top end of the backplane, including the front of the backplane. FIG. 2C shows a detail view of the top end of the backplane, including the back of the backplane, i.e., a surface of the backplane that faces away from the IT appliances inserted into the IT rack.

In one embodiment of the technology, the backplane (210) includes a vertically extending tubular member (212). The tubular member (212) may vertically span all IT appliances, from the bottom-most appliance to the top-most appliance in the IT rack, when mounted on an IT rack, as shown in FIG. 1. Alternatively, the tubular member may only span a subset of IT appliances, e.g., a set of IT appliances located in the upper half of the IT rack, or a set of appliances located in the lower half of the IT rack. The tubular member (212) may be made of metal, plastic or a composite material and may, for example, have a rectangular cross-section. The space within the tubular member (212) may be used to accommodate connectivity between connectors (214, 216) interfacing with IT appliances and a central location of the backplane (210), where a patch panel (218) and a power infeed (222) may be located.

Those skilled in the art will recognize that even though the backplane (210), shown in FIG. 2A, is described as including a tubular member (212), any other vertically extending structure capable of accommodating the connectors (214, 216) interfacing with the IT appliances in the IT rack and the wiring between these connectors and the central location may be used instead of the tubular member (212). The vertically extending structure may be, for example, an open structure, e.g., a U-shaped profile.

The backplane may be equipped with appliance-interfacing data connectors (214) that, upon insertion of the IT appliance, may receive corresponding backplane-interfacing data connectors, located on the back of the IT appliance being inserted. The backplane may further be equipped with appliance-interfacing power connectors (216) that, upon insertion of the IT appliance may receive corresponding backplane-interfacing power connectors, located on the back of the IT appliance being inserted. In one embodiment of the technology, the appliance-interfacing data and/or power connectors (214, 216) may be placed on a surface of the tubular member that faces the back of the IT appliances.

As illustrated in FIG. 1, the backplane (210) may attach to the back of the IT rack (100). The backplane (210) may be located such that connectors of an IT appliance mate with corresponding connectors (214, 216) on the backplane, as the IT appliance is inserted into the rack. In the exemplary embodiment shown in FIGS. 2A-2C, the appliance-interfacing data connectors (214) directly face the back of IT appliances (130) being inserted into the IT rack (100). The appliance-interfacing power connectors (216) face away from the back of the IT appliances (130) being inserted into the IT rack (100). Insertion of the IT appliance may therefore result in mating of the appliance-interfacing data connectors (214) with the corresponding backplane-interfacing data, but not of the power connectors (216). Bridging links (not shown) may be used to establish a connection between the appliance-interfacing power connectors (216) of the backplane (210) and the backplane-interfacing power connectors of the IT appliances. In one embodiment of the technology, the bridging link may simultaneously function as a mechanical latch, locking the IT appliance in place, once connected to the backplane (210) by the bridging link.

In an alternative embodiment, data and power appliance-interfacing connectors (214, 216) of the backplane (210) directly face the IT appliances being inserted into the IT rack (100). Alternatively data and power appliance-interfacing connectors (214, 216) of the backplane (210) may be facing away from the back of the IT appliances (130), thus necessitating bridge links for data and power connectivity.

In an alternative embodiment of the technology, the appliance-interfacing data and/or power connectors (214, 216) of the backplane face away from the IT appliance. Insertion of the IT appliance may therefore not result in mating of the appliance-interfacing data and/or power connectors (214, 216) with the corresponding backplane-interfacing data and/or power connectors of an IT appliance. Instead, an additional bridging connector (not shown) may be used to establish a connection between the appliance-interfacing data and/or power connectors (214, 216) of the backplane and the backplane-interfacing data and/or power connectors of an IT appliance. In one embodiment of the technology, the bridging connector may also function as a mechanical latch, locking the IT appliance in place, once connected to the backplane (210) by the bridging connector.

In one embodiment of the technology, the grouping, geometric location and types of appliance-interfacing data and/or power connectors (214, 216) may be standardized, such that for each IT appliance to be inserted into the IT rack, the configuration of appliance-interfacing data and/or power connectors (214, 216) is reproducible, regardless of where in the IT rack an IT appliance is inserted. Accordingly, the same set of appliance-interfacing data and/or power connectors (214, 216) may be repeatedly installed along the backplane. In the exemplary embodiment shown in FIG. 2A, eight groups of appliance-interfacing data and power connectors (214, 216) are installed in the backplane, thus enabling the backplane (210) to support eight IT appliances in an IT rack equipped with the backplane (210). Those skilled in the art will however recognize that a backplane, in accordance with an embodiment of the technology, may be equipped with any number of appliance-interfacing data and/or power connectors. The number of appliance-interfacing data and/or power connectors in the backplane may be governed by the number of IT appliances to be housed by an IT rack, equipped with the backplane (210). While a backplane may have at least one appliance-interfacing data and/or power connector per IT appliance to be inserted into an IT rack, a backplane may also have multiple appliance-interfacing data and/or power connectors per IT appliance, for example to provide additional data lines to increase communication bandwidth, and/or to provide additional power connections, e.g. for multiple redundant power supplies.

The vertical connector spacing of these groups of connectors may be governed by the geometry of the IT appliances to be inserted into the IT rack. For example, if IT appliances to be inserted into the IT rack are exclusively four rack units high, the same group of appliance-interfacing data and/or power connectors (214, 216) may be provided repeatedly, using a four rack unit spacing. Alternatively, if single rack unit height equipment may be installed, the same group of appliance-interfacing data and/or power connectors (214, 216) may be provided repeatedly, using a single rack unit spacing. Appliance-interfacing data and/or power connectors (214, 216) may be adjacently located, or they may be spatially separated. Alternatively, separate backplanes may be used for data signal and power distribution. In this case, a power backplane may house only appliance-interfacing power connectors (216), whereas a data backplane may house only appliance-interfacing data connectors (214). All appliance-interfacing data and/or power connectors, in accordance with one or more embodiments of the technology, are wired to a centrally located interface that may include a patch panel (218) and/or a centrally located power infeed (222), respectively.

An appliance-interfacing data connector (214), in accordance with one or more embodiments of the technology, may be any type of blind-mate connector capable of carrying one or more data signals of an IT appliance. Typical electrical and/or optical interfaces that may send/receive data signals and may thus rely on appliance-interfacing data connectors may include, but are not limited to, network interfaces such as Ethernet network interfaces, computer bus systems such as the peripheral component interconnect express (PCIe), data storage interfaces such as serial attached SCSI (SAS), etc.

The combination of appliance-interfacing data connector (214) and the corresponding connector on an IT appliance may be self-centering such that a small misalignment between the two mating connectors may be compensated for, thus allowing mating of the connectors, despite the misalignment. An appliance-interfacing data connector (214), in accordance with one or more embodiments of the technology, may carry any type and number of electrical and/or optical data signals. Accordingly, an appliance-interfacing data connector (214) may be equipped with any number of electrical contacts and/or optical fiber ends.

In one or more embodiments of the technology, each of the appliance-interfacing data connectors (214) is wired to a patch panel connector (220) in the centrally located patch panel (218). The wiring between the patch panel connectors (220) and the appliance-interfacing data connectors (214) may be routed through the tubular member (212) of the backplane (210). The wiring may include bundles of electrical wires and/or bundles of optical fibers. The patch panel (218) may reproduce the wiring configuration of the appliance-interfacing data connectors (214), i.e., there may be a one-to-one mapping between the appliance-interfacing data connectors (214) and the patch panel connectors (220). Alternatively, data connections between appliance-interfacing data connectors (214) and patch panel connectors (220) may be re-mapped. For example, larger connectors with more contacts may be used at the patch panel (218) in order to group the data signals of multiple appliance-interfacing data connectors (214) in a single patch panel connector (220). In one or more embodiments of the technology, the patch panel connectors (220) are blind-mate connectors. The patch panel connectors (220) may interface with corresponding connectors on a cross-connect module (not shown), to be connected to the patch panel (218), as further described below, with reference to FIG. 5. Alternatively, individual connectors that may, for example, directly connect to other equipment in a data center, may be plugged into the patch panel connectors (220).

An appliance-interfacing power connector (216), in accordance with one or more embodiments of the technology, may be any type of connector capable of transmitting sufficient power to operate an IT appliance. The design of the connector may depend on electrical power requirements of the IT appliances. For example, the size, shape and number of contacts of the connector may depend on voltage requirements, current requirements, and it may further depend on whether an IT appliance is AC-powered or DC powered. In one embodiment of the technology, no power connector is used. Instead, the backplane (210) may house a set of continuous conductors (not shown) that an IT appliance may directly interface with. For example, the backplane may house a set of bus bars (e.g., parallel metallic rods) that vertically extend within the tubular member (212). An IT appliance may be equipped with contact clips that directly interface with the bus bars, thus establishing electrical contacts, once the IT appliance is inserted into the IT rack.

In one or more embodiments of the technology, each of the appliance-interfacing power connectors (216) is connected to the centrally located power infeed (222). The wiring between the centrally located power infeed (222) and the appliance-interfacing power connectors (216) may be routed through the tubular member (212) of the backplane (210). The wiring may include bundles of electrical wires. Alternatively, the wires may be the previously described vertically extending bus bars that may be connected to the power infeed (222), for example, by wires or braided connectors. The power infeed (222) may be a power cable that terminates in a power connector or that directly connects to a circuit breaker panel. Those skilled in the art will appreciate that aspects of the power distribution via the backplane (210) may be specific to the power requirements of the IT appliances in the IT rack. For example, voltage and current requirements and/or whether a single phase or a 3-phase AC supply or a DC supply concept is implemented, may affect the design, size and/or number of connectors, conductors, the routing of the conductors, etc. Further, the design may also be affected by local regulations, data center requirements and/or preferences.

In one or more embodiments of the technology, as previously discussed, an IT rack is equipped with multiple backplanes, for example, in order to achieve redundancy. Accordingly multiple backplanes, similar or identical to the backplane shown in FIGS. 2A-2C, may exist. If two backplanes are used, the second backplane may be mirror-symmetric to the backplane shown in FIGS. 2A-2C.

Figure 3:
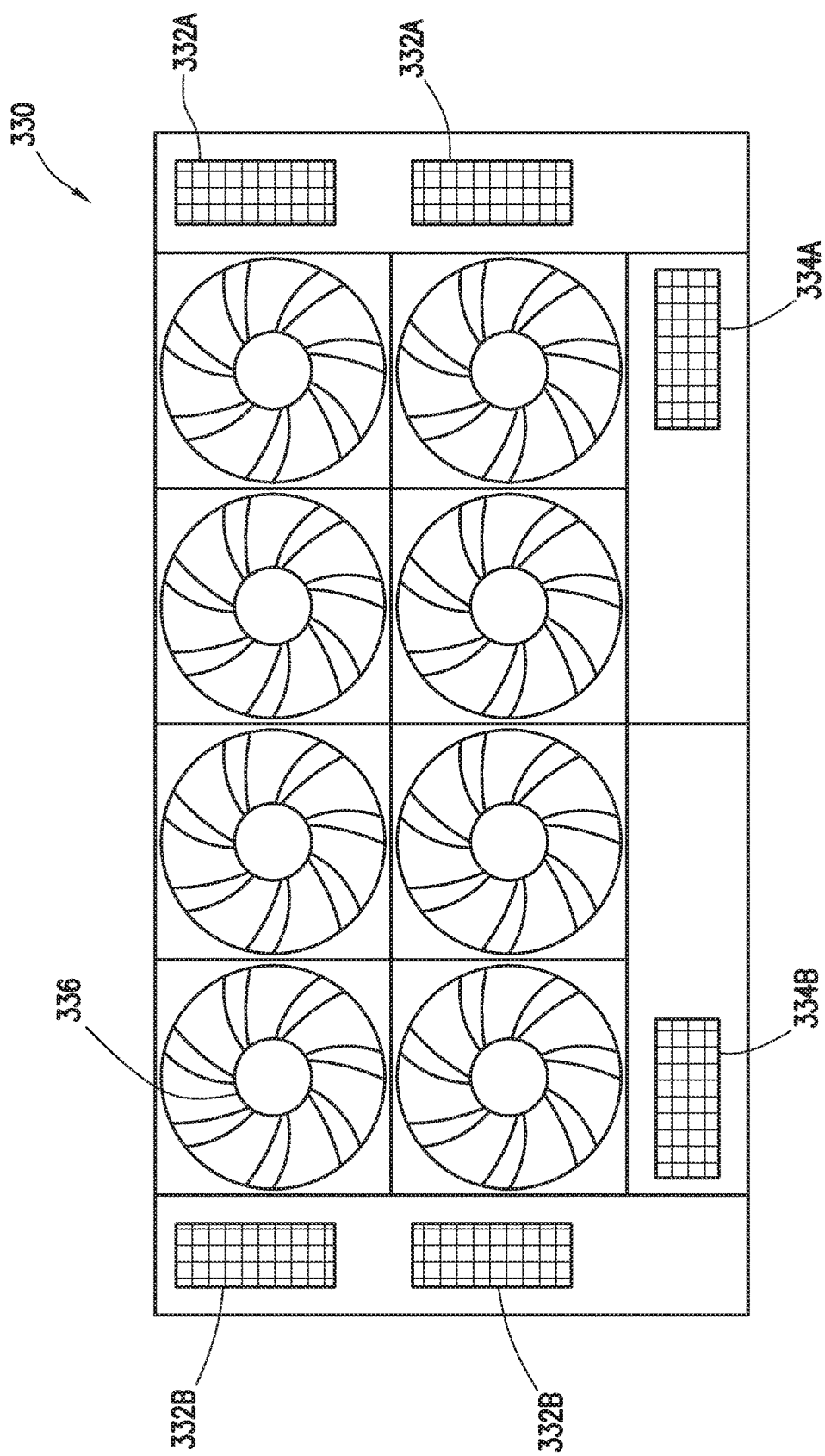
FIG. 3 shows a rack-mount IT appliance in accordance with one or more embodiments of the technology.

FIG. 3 shows a rear view of an IT appliance in accordance with one or more embodiments of the technology. The IT appliance (330), as previously described, may be any type of rack-mountable IT and/or telecommunication equipment that may include electronic circuits, housed by a rack-mount enclosure.

In one or more embodiments of the technology, the IT appliance (330) includes backplane-interfacing data connectors A and B (332A, 332B) that are compatible with the previously described appliance-interfacing data connectors. Depending on the data transmission needs of the IT appliance, a single or multiple backplane-interfacing data connectors A (332A) and a single or multiple backplane-interfacing data connectors B (332B) may be installed. Analogous to the previously described appliance-interfacing data connectors, backplane-interfacing data connectors, in accordance with one or more embodiments of the technology, may carry any type and number of electrical and/or optical data signals.

The backplane-interfacing data connectors A and B (332A, 332B) may be located in the back of the IT appliance, positioned to mate with the corresponding appliance-interfacing data connectors of the backplane, previously described with reference to FIGS. 2A and 2B. Accordingly, types and location of the connectors may be standardized and may be compatible with the mating appliance-interfacing connectors of the backplane. In one embodiment of the technology, the backplane-interfacing data connectors A and B (332A, 332B) are redundant, i.e., for each backplane-interfacing data connector A (332A), there is a corresponding backplane-interfacing data connector B (332B), capable of carrying the same data signals. The electronic circuits of the IT appliance (330), communicating via the backplane-interfacing data connectors A and B (332A, 332B) may thus have the capability to perform communications via the backplane-interfacing data connectors A and B (332A, 332B).

In one or more embodiments of the technology, the IT appliance (330) may further include backplane-interfacing power connectors A and B (334A, 334B). A single backplane-interfacing power connector A (334A) and a single backplane-interfacing power connector B (334B) may be installed, or multiple power connectors may be installed, for example if separate connectors are used to interface with the phases of a 3-phase AC power distribution system.

The backplane-interfacing power connectors A and B (334A, 334B) may be located in the back of the IT appliance, positioned to mate with the corresponding appliance-interfacing power connectors of the backplane, previously described with reference to FIG. 2C. Accordingly, types and location of the connectors may be standardized and may be compatible with the mating appliance-interfacing connectors of the backplane. In one embodiment of the technolgy, the backplane-interfacing power connectors A and B (334A, 334B) are redundant, i.e., for each backplane-interfacing power connector A (334A), there is a corresponding backplane-interfacing power connector B (334B). These redundant connectors may, for example, connect to separate power supplies of the IT appliance (330).

In the exemplary embodiment of the IT appliance (330), shown in FIG. 3, the backplane-interfacing power connectors A and B (334A, 334B) do not directly interface with the appliance-interfacing power connectors (216) of the backplanes (210). Instead, bridging connectors may be used to establish the electrical connection, as previously described with reference to FIGS. 2A-2C.

In one embodiment of the technology, the back of the IT appliance (330) further accommodates one or more ventilation openings (336). The ventilation openings may, for example, form the exhausts for a fan-ventilated enclosure of the IT appliance (330). The ventilation openings (336) are located such that they are not obstructed by the backplane(s), when the IT appliance (330) is inserted into an IT rack.

Figure 4:
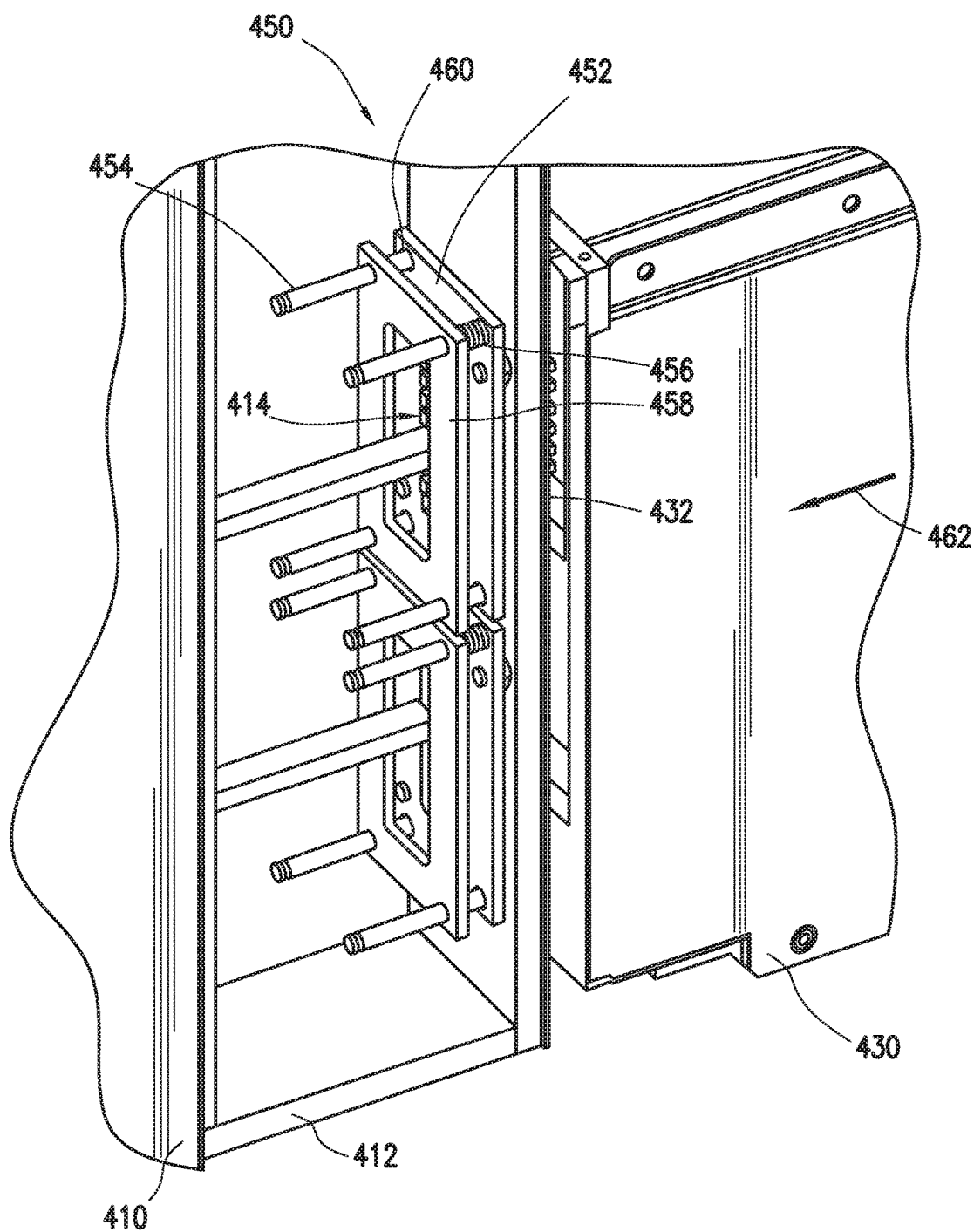
FIG. 4 shows a floating connector assembly in accordance with one or more embodiments of the technology.

FIG. 4 shows a floating connector assembly, in accordance with one or more embodiments of the technology. The floating connector assembly (450) may enable proper alignment between an appliance-interfacing data connector (414), installed on the backplane (410), and a mating backplane-interfacing data connector (432). The floating connector assembly may allow movement in one or more degrees of freedom to accommodate offsets between the appliance-interfacing data connector (414) and the backplane-interfacing data connector (432) that may be a result of, for example, manufacturing and/or assembling tolerances.

In one embodiment of the technology, the appliance-interfacing data connector (414) is mounted on a floating connector bracket (452). The floating connector bracket may be supported by guideposts (454). In the exemplary embodiment shown in FIG. 4, four cylindrical guideposts that are aligned with four cylindrical holes (460) in the floating connector bracket (452) provide support to the floating connector bracket (452). The diameter of the cylindrical holes (460) may be larger than the diameter of the cylindrical guideposts (454) thus allowing limited movement of the connector bracket, and the appliance-interfacing data connector (414) mounted thereon. The allowed movement may compensate for misalignment between the appliance-interfacing data connector (414) and the backplane-interfacing data connector (432) in directions perpendicular to the insertion direction (462) of the IT appliance (430). Misalignments of up to multiple millimeters may be compensated for by the floating connector assembly.

In one embodiment of the technology, compression springs (456) may exert a force in the direction opposite to the insertion direction of the IT appliances on the floating connector bracket (452), thereby maintaining the appliance-interfacing data connector (414) in position during the mating with the corresponding backplane-interfacing data connector (432), while simultaneously enabling the appliance-interfacing connector (414) to sufficiently move in order to compensate for depth misalignments. For example, if a backplane-interfacing data connector (432) excessively protrudes from the IT appliance (430) being inserted into the IT rack, the excessive depth may be compensated for by the compression springs (456) being compressed, thereby enabling the mating appliance-interfacing data connector (414) to move inward. The compression springs may be supported by a support frame (458) and may be seated on one or more of the guideposts (454).

Those skilled in the art will recognize that similar floating connector assemblies may be used to compensate for misalignments of power connectors, without departing from the technology. Further, even though the exemplary embodiment displayed in FIG. 4 shows the floating connector assembly installed on the backplane (410), a floating connector assembly may alternatively or additionally be installed on the IT appliance (430). Also, groups of connectors, rather than a single connector, may be supported by a single floating connector assembly.

In one or more embodiments of the technology, multiple stages of alignment are used. For example, the floating connector assembly, shown in FIG. 4 may be used to perform a coarse alignment of connectors by allowing compensation for misalignments of up to multiple millimeters. Additional stages may be used for precision alignment. For example, the appliance-interfacing data connectors (141) may be blindmating connectors capable of alignment with micrometer precision, enabling self-alignment of, e.g., optical fiber interfaces in connectors carrying optical signals.

In one embodiment of the technology, floating connectors or groups of floating connectors are further equipped with a detaching mechanism, e.g., a lever, that facilitates separation of backplane-interfacing connectors from mating dataplane-interfacing connectors. The lever may, for example, push the IT appliance in a direction opposite to the insertion direction (462) and may provide a mechanical advantage that reduces the force necessary to separate the connectors.

Figure 5:
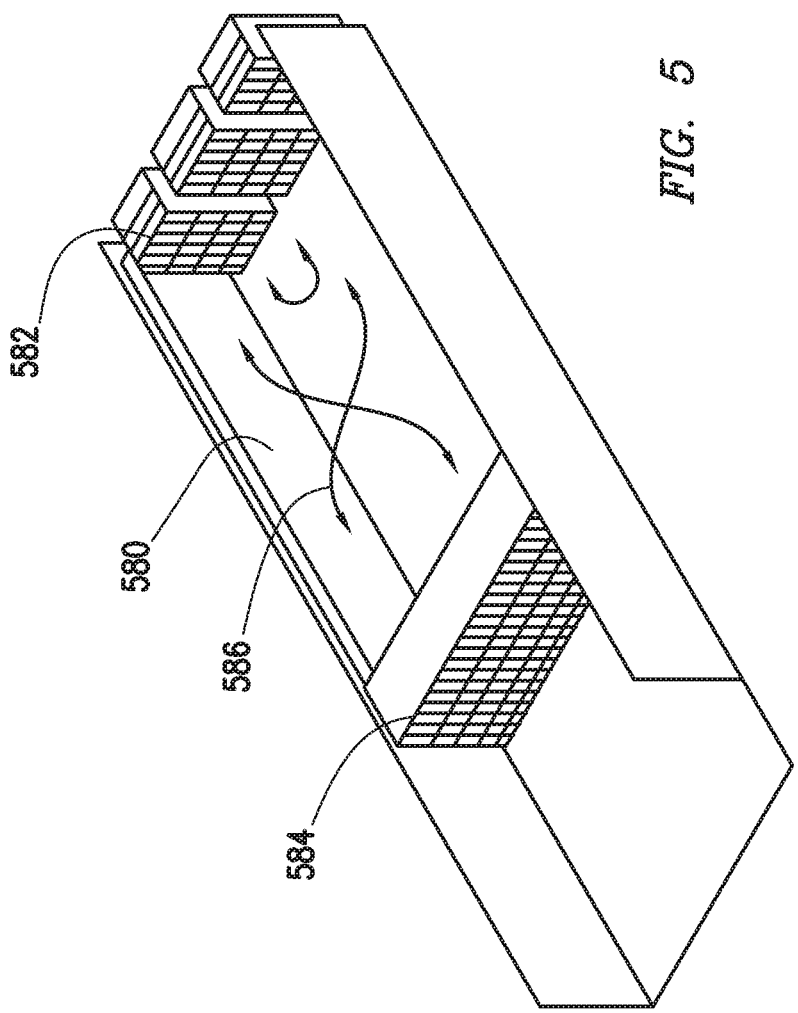
FIG. 5 shows a cross-connect module of an IT rack in accordance with one or more embodiments of the technology.

FIG. 5 shows a cross-connect module, in accordance with one or more embodiments of the technology. The cross-connect module (580), may interface with the patch panel connectors (220) of the patch panel (218), as previously described with reference to FIG. 2B. The cross-connect module (580), when connected to the patch panel connectors, may establish data signal connectivity to/from the IT appliances in the IT rack via a cross-connect module fabric (586). The fabric (586) may include electrical and/or optical connectivity, as needed to interface with the patch panel connectors. In one embodiment of the technology, the cross-connect module (580) may be the location where all connections to/from the IT appliances may be defined by the cross-connect module fabric (586). Accordingly, a change in the connectivity of IT appliances may be accomplished by updating the fabric (586) of the cross-connect module (580). No other wiring changes elsewhere may be necessary in order to update the wiring of IT appliances. The cross-connect module, in accordance with an embodiment of the invention, may be pre-manufactured thus enabling rapid deployment of an IT rack. The pre-manufacturing may include pre-configuring the fabric (586) to provide all the desired data connections for the IT appliances (130) in the IT rack (100). After insertion of the IT appliances (130) into the IT rack (100) and connection of the cross-connect module (580), all data connections between the IT appliances may thus be established via the fabric (586) of the cross-connect module without requiring conventional wiring of the IT rack (100).

A cross-connect module in accordance with an embodiment of the technology therefore has patch panel-interfacing connectors (582) that, when the cross-connect module is attached to the backplane, interface with the corresponding patch panel connectors on the backplane. The patch panel-interfacing connectors (582) may be wired cross-connect module-internally by the fabric (586). The fabric (586) may include electrical and/or optical connectivity, e.g., in the form of bundles of wires and/or fibers, traces on printed circuit boards, etc. Arbitrary fabrics may be generated as needed to establish the desired connectivity to and from IT appliances (130) in the IT rack (100).

The fabric may, when the cross-connect module (580) is installed in the IT rack, for example, establish connectivity between IT appliances by connecting specific data signal lines of a specific patch panel connector to other specific data signal lines of the same or a different patch panel connector, thus enabling the IT appliances to communicate among each other. Further, the fabric (586) may establish connectivity to an external environment, e.g., to other IT appliances in other IT racks in a data center, or to any other equipment located outside the IT rack (100).

Connectivity to the external environment may be provided via additional connectors in the cross-connect module. These data center-interfacing connectors (584) may be selected to be compatible with the wiring and connector standards of the data center and may be, for example, Ethernet jacks, receptacles for single or multiple optical fibers, and/or other connector standards used throughout the data center. The cross-connect module fabric (586) may thus establish connections between data signal lines of patch panel connectors and data signal lines of connectors of other rack external IP appliances, as necessary to enable communication between the rack internal IT appliances and the rack external IP appliances.

As previously noted, the cross-connect module (580), including the fabric (586), may be pre-manufactured to eliminate or at least reduce in-the-field wiring. The wiring of an existing cross-connect module may be updated by either replacing the existing cross-connect module with a differently wired cross-connect module, or alternatively by updating the wiring of the existing cross-connect module.

In one embodiment of the technology, the fabric (586) is static, i.e., the implemented connectivity may not be changed without modification of the fabric. Alternatively, the fabric may be configurable. In case of electrical data signals, e.g. Ethernet signals, a network switch may establish connections as necessary and/or desired. The network switch may be a component of the fabric (586) and may thus enable the cross-connect module to provide network switch functionality, enabling the cross-connect module to provide configurable rather than static connectivity. Alternatively or in addition, a network switch may be located within the IT rack, i.e., the switch may be one of the IT appliances in the IT rack. In this scenario, connectivity updates may be performed without modification of the fabric (586) of the cross-connect module (580). In case of optical signals, an optical switch, e.g., an optical 3D MEMS switch may allow the programming and updating of the optical fabric without physically modifying the fabric. If packet switching of optically communicated data packets is desired, optical signals may be converted to electrical signals, and may then be processed electrically, e.g. using an Ethernet switch. In this case, the cross-connect module (580) may include fiber media converters to convert, for example, an optical signal into an Ethernet signal that may then be processed by an Ethernet switch in the cross-connect module (580).

In embodiments of the technology where an IT rack is equipped with multiple backplanes, each backplane may be equipped with a separate cross-connect module. If necessary, cross connections between the cross-connect modules may be implemented to interconnect the backplanes.

Embodiments of the technology may enable an IT rack to be pre-wired without sacrificing flexibility. Accordingly, an IT rack in accordance with an embodiment of the technology may be rapidly and cost-effectively deployed by eliminating or at least reducing the need for time consuming on-site wiring of the IT appliances in the IT rack.

Even IT appliances that require numerous data signal and power connections may be added to an IT rack solely by inserting the IT appliances into the IT rack, and by updating the cross-connect module that interfaces with the IT rack, if necessary. No individual data signal and/or power connections may need to be manually made, thus saving time and cost, and in addition increasing reliability by reducing the risk of wiring errors and accidental disconnects.

The connectivity within the rack, in accordance with one or more embodiments of the technology, is defined by the cross-connect module. If necessary, the wiring of IT appliances in the IT rack may be updated at any time by replacing an existing cross-connect module with and updated cross-connect module, or by updating the existing cross-connect module. Alternatively, if the cross-connect module has switching capabilities, the connectivity of the IT appliances may be updated by reprogramming the switch.

The cross-connect module may further provide an interface to other equipment outside of the IT rack. The cross-connect module may be equipped with customized connectors as necessary to interface with other data center equipment. The cross-connector may thus provide an interface between the standardized connectivity within the IT rack and custom-connectivity of the data center.

Embodiments of the technology further provide at least two backplanes thus making the backplanes of the IT rack redundant. A backplane may therefore be removed, for example for maintenance, without disrupting the operation of IT appliances in the IT rack.

The backplanes of an IT rack in accordance with one or more embodiments of the technology may further implement a power distribution system. Accordingly, insertion of an IT appliance into the rack may not only establish all necessary data signal connections but also all necessary power connections.

While the technology has been described with respect to a limited number of embodiments, those skilled in the art, having benefit of this disclosure, will appreciate that other embodiments can be devised which do not depart from the scope of the technology as disclosed herein. Accordingly, the scope of the technology should be limited only by the attached claims.

What is claimed is:

1. An information technology (IT) rack comprising: IT appliances housed by the IT rack; a plurality of backplanes, wherein each backplane of the plurality of backplanes comprises appliance-interfacing connectors, and wherein insertion of the IT appliances into the IT rack causes mating of backplane-interfacing connectors of the IT appliances with the appliance-interfacing connectors; and a centrally located interface to which the appliance-interfacing connectors are wired, wherein the centrally located interface determines a connectivity of the IT appliances, wherein each backplane of the plurality of backplanes comprises a surface that faces away from the IT appliances in the IT rack, wherein an appliance-interfacing connector is located on the surface that faces away from the IT appliances, and wherein the appliance-interfacing connector, located on the surface that faces away from the IT appliances, is connected to a corresponding backplane-interfacing connector of the IT appliances using a bridging connector.

2. The IT rack of claim 1, wherein each backplane of the plurality of backplanes comprises a vertically elongated tubular member with a surface that faces the IT appliances in the IT rack, wherein at least one of the appliance-interfacing connectors is located on the surface that faces the IT appliances.

3. The IT rack of claim 1, wherein the appliance-interfacing connectors are appliance-interfacing data signal connectors.

4. The IT rack of claim 3, wherein the appliance-interfacing data signal connectors are a blindmate connectors.

5. The IT rack of claim 3, wherein the appliance-interfacing data signal connector is held by a floating connector assembly, and wherein the floating connector assembly compensates for misalignments between the appliance-interfacing data signal connector and a mating backplane-interfacing connector of an IT appliance.

6. The IT rack of claim 5, wherein the floating connector assembly comprises:
a floating connector bracket that mechanically supports the appliance-interfacing data signal connector, configured to enable limited movement of the appliance-interfacing data signal connector in directions perpendicular to an insertion direction of the IT appliance; and
a plurality of guide posts that constrain the movement of the floating connector bracket in the directions perpendicular to the insertion direction of the IT appliance.

7. The IT rack of claim 6, wherein the floating connector bracket is further configured to enable limited movement of the appliance-interfacing data signal connector in directions parallel to the insertion direction of the IT appliance, and
wherein at least one compression spring exerts a force on the floating connector bracket, in a direction opposite to the insertion direction of the IT appliance.

8. The IT rack of claim 5, wherein the floating connector assembly further comprises a detaching lever with a mechanical advantage, configured to separate the appliance-interfacing data connector from the mating backplane-interfacing data connector.

9. The IT rack of claim 3, wherein the centrally located interface comprises a patch panel, the patch panel comprising a plurality of patch panel connectors, and wherein the appliance-interfacing data connectors are wired to the patch panel connectors.

10. The IT rack of claim 9, wherein the connectivity between the IT appliances is determined by a cross-connect module interfacing with the plurality of patch panel connectors, by a cross-connect module fabric that interconnects the patch panel connectors.

11. The IT rack of claim 10, wherein the cross-connect module fabric is an Ethernet fabric.

12. The IT rack of claim 11, wherein the Ethernet fabric comprises an Ethernet switch.

13. The IT rack of claim 10, wherein the cross-connect module fabric is a fiber-optic fabric.

14. The IT rack of claim 13, wherein the fiber-optic fabric comprises a 3D MEMS switch.

15. The IT rack of claim 10,
wherein the cross-connect module is pre-manufactured; and
wherein the cross-connect module fabric is pre-configured.

16. The IT rack of claim 10, wherein the cross-connect module further comprises data center-interfacing connectors, connected to the cross-connect module fabric, that establish a connectivity between the IT appliances within the IT rack and rack-external IT appliances.

17. The IT rack of claim 3, wherein the appliance-interfacing data connectors are fiber-optic connectors.

18. The IT rack of claim 3, wherein the appliance-interfacing data connectors are electrical connectors.

19. The IT rack of claim 1, wherein the appliance-interfacing connectors are appliance-interfacing power connectors.

20. The IT rack of claim 19, wherein the centrally located interface comprises a power infeed, and wherein the appliance-interfacing power connectors are wired to the power infeed.

21. The IT rack of claim 1, wherein the plurality of backplanes comprises two backplanes that are functionally redundant.

* * * * *